United States Patent
Nara (10) Patent No.: US 8,374,812 B2
(45) Date of Patent: Feb. 12, 2013

(54) SIGNAL ANALYZER AND METHOD FOR PRODUCING DATA THEREFORE

(75) Inventor: Akira Nara, Tokyo (JP)

(73) Assignee: Tektronix, Inc., Beaverton, OR (US)

( * ) Notice: Subject to any disclaimer, the term of this patent is extended or adjusted under 35 U.S.C. 154(b) by 303 days.

(21) Appl. No.: 12/516,190

(22) PCT Filed: Nov. 22, 2007

(86) PCT No.: PCT/JP2007/072677
§ 371 (c)(1),
(2), (4) Date: Feb. 24, 2010

(87) PCT Pub. No.: WO2008/062875
PCT Pub. Date: May 29, 2008

(65) Prior Publication Data
US 2010/0153044 A1    Jun. 17, 2010

(30) Foreign Application Priority Data
Nov. 24, 2006   (JP) ................................. 2006-317398

(51) Int. Cl.
*G01R 23/16* (2006.01)
*G01R 23/00* (2006.01)
(52) U.S. Cl. ....................... 702/76; 324/76.19
(58) Field of Classification Search ..................... 702/76, 702/57–60, 64–75, 79–81, 84–85, 89, 106–108, 702/117–120, 123–127, 176, 182–183, 189–190; 324/76.11, 76.19, 76.22, 76.35, 76.39, 76.41, 324/76.52, 76.77; 375/224–228, 238–240
See application file for complete search history.

(56) References Cited

U.S. PATENT DOCUMENTS

| 5,075,618 A | 12/1991 | Katayama |
| 6,356,067 B1 * | 3/2002 | Nara ............................ 324/76.23 |
| 6,484,111 B1 | 11/2002 | Nara |
| 2003/0039319 A1 | 2/2003 | Engelse et al. |

FOREIGN PATENT DOCUMENTS

| JP | 03220464 | 9/1991 |
| JP | 10227816 | 8/1998 |
| JP | 2001272420 A | 10/2001 |
| JP | 2003207524 A1 | 7/2003 |
| JP | 2005501267 A | 1/2005 |
| JP | 2005121457 A | 5/2005 |

* cited by examiner

*Primary Examiner* — Toan M Le
(74) *Attorney, Agent, or Firm* — Matthew D. Rabdau; Michael A. Nelson

(57) ABSTRACT

A first frequency analysis range and a second frequency analysis range narrower than the first one are set with an operation panel 34, etc. A first signal path 171 produces first time domain data of a frequency converted signal under test by a first data production rate depending on the first frequency analysis range. A second signal path 172 produces second time domain data of frequency converted signal under test by a second data production rate depending on the second frequency analysis range and slower than the first data production rate. A CPU receives the first and second time domain data in parallel and produces first and second frequency domain data by FFT wherein frequency shift amounts in the frequency conversions in the first and second signal paths are different depending on the difference between the center frequencies of the first and second frequency analysis ranges.

8 Claims, 7 Drawing Sheets

SIGNAL ANALYZER AND METHOD FOR PRODUCING DATA THEREFORE

TECHNICAL FIELD

The present invention relates to a signal analyzer that produces data by acquiring data of a first analysis range on the frequency domain or time domain of a signal under test and data of a second analysis range that is a desired portion in the first analysis range for a zoom display while updating and displaying the first and second analysis ranges at the same time.

BACKGROUND ART

A signal analyzer is known as it can analyze a signal (signal under test) such as a wireless signal of a mobile phone etc. from a viewpoint of frequency domain and/or time domain. For example, RSA3408A Real-Time Spectrum Analyzer manufactured by Tektronix, Inc. produces and analyzes time and frequency domain data of a signal under test in real time.

Figure 1:
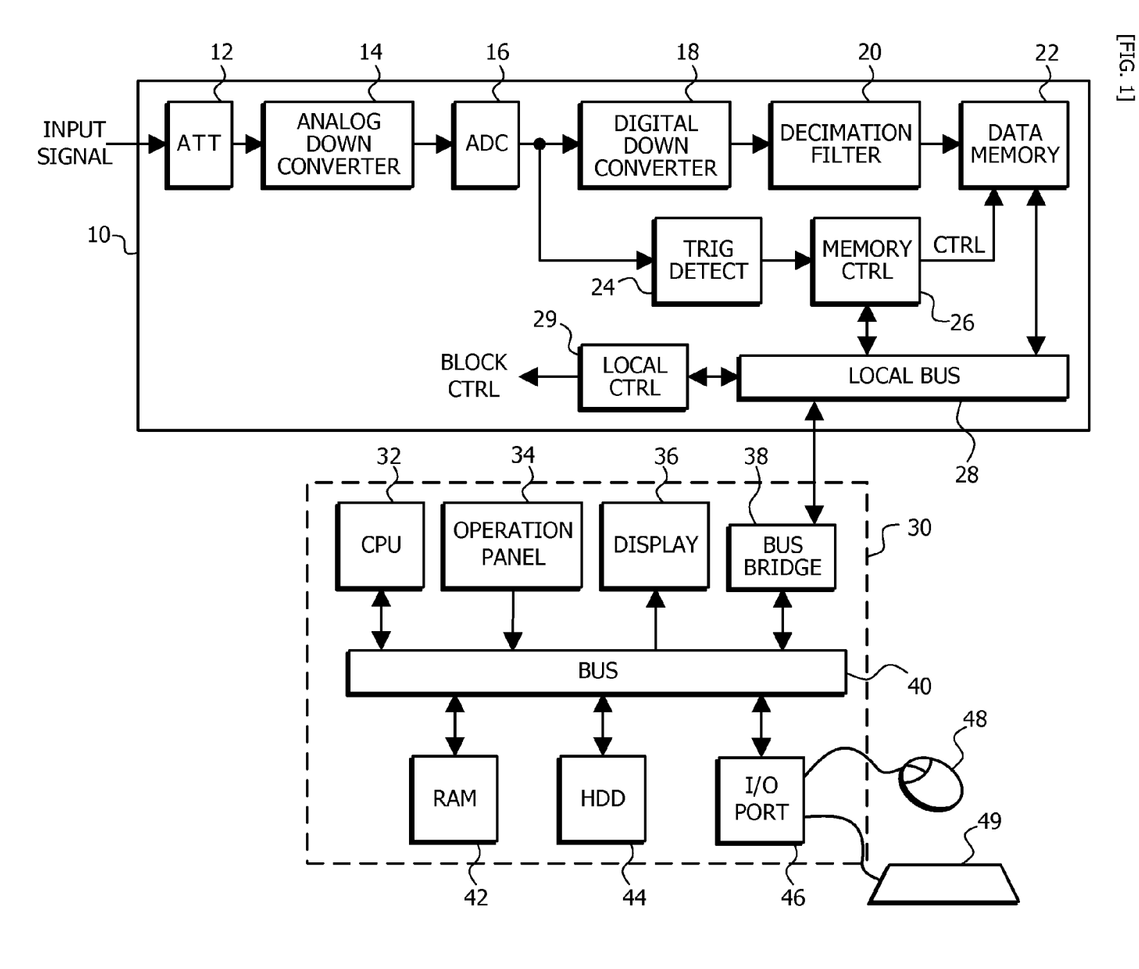
FIG. 1 A block diagram of hardware of a conventional signal analyzer

FIG. 1 is a block diagram of a signal analyzer hardware currently known. It has signal analysis block 10 and PC block 30. The PC block 30 is substantially the same as a general PC and adopts operating software that realizes multi-tasks with multi-windows.

An input signal (signal under test) is adjusted with an input attenuation 12 and provided to an analog down converter 14 to down-convert it to an intermediate frequency (IF) signal. An analog to digital converter (ADC) 16 converts the analog IF signal to digital data of time domain. A digital down converter 18 may be realized in an FPGA, for example. It multiples the time domain data by sine and cosine data of a local oscillation frequency according to a center frequency set by a user in digital calculation for I/Q separation and down converts the frequency. A decimation filter 20 decimates the digitally down-converted IF data to have a proper data number and provides the date to a data memory 22. A trigger detection circuit 24 detects a trigger point satisfying a time domain trigger condition in the time domain data from the ADC 16. A memory controller 26 controls data kept in the memory 22 based on the detected trigger point. Another trigger condition may be set on the frequency domain data described below and data kept in the memory 22 may be controlled according to this condition. A local controller 29 is controlled by a CPU 32 via a local bus 28, bus bridge 38 and bus 40 and controls the blocks in the signal analysis block 10. The data kept in the data memory 22 is provided to the PC block 30 via the local bus 28.

The PC block 30 temporarily keeps the time domain data from the data memory 22 in a memory (RAM) 42 and the CPU 32 conducts fast Fourier transform (FFT) to produce the frequency domain data. A display 36 displays the time domain data and/or frequency domain data as waveforms, numeric values, etc. according to user settings. The user sets desired settings such as center frequency, frequency span, etc. to the signal analyzer through an operation panel 34 wherein a mouse 48 and keyboard 49 coupled via an input/output port 46 may be used. The produced data is stored in a hard disk drive (HDD) 44 so that the past data can be read out to display. The HDD 44 stores application software necessary for the signal analyses as well as multi-window type operation software that is commonly used for a PC. These blocks are coupled via bus 40.

Figure 2:
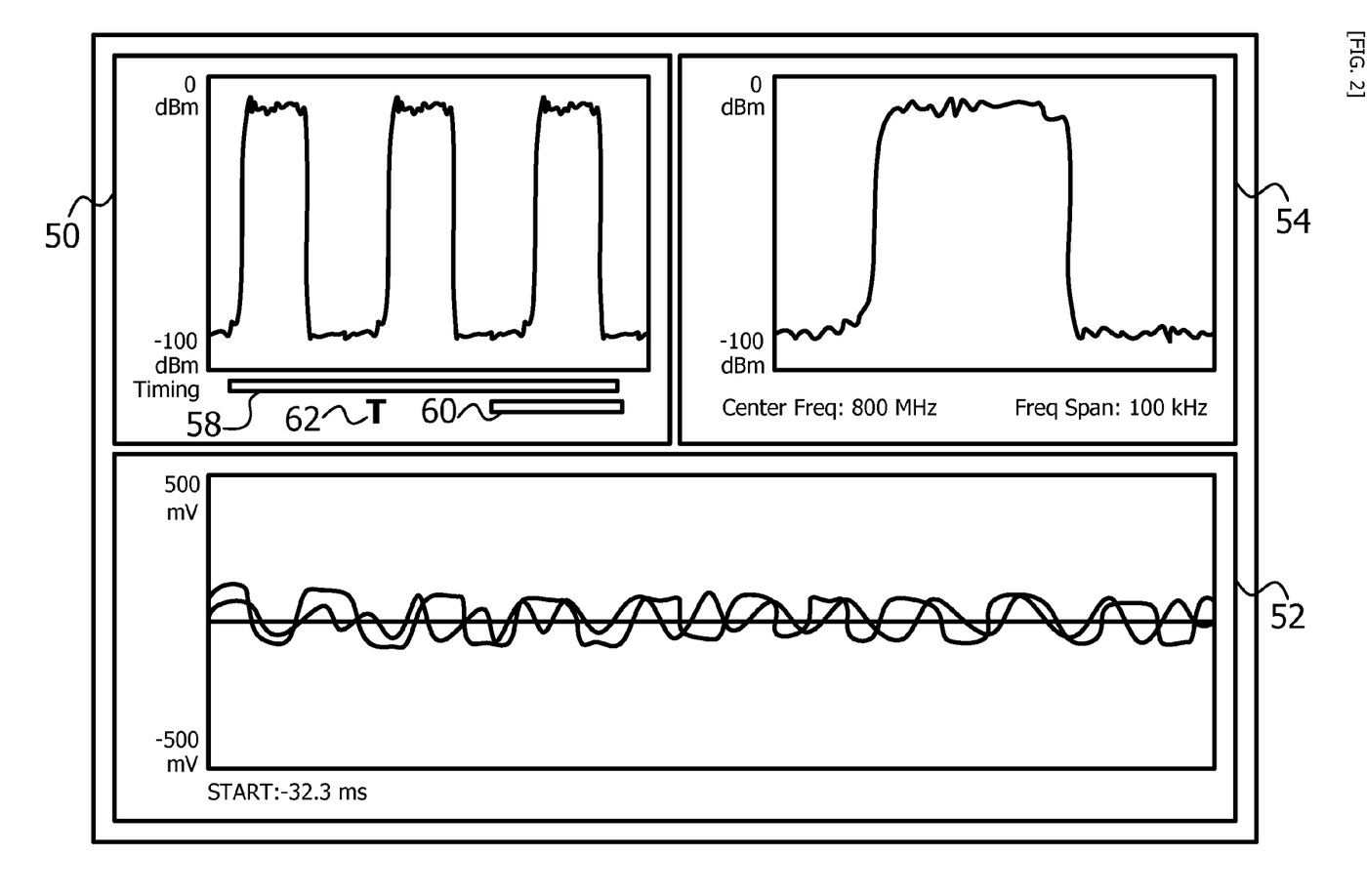
FIG. 2 A display example using time domain data and frequency domain data

FIG. 2 is a display example with an existing signal analyzer. A first display area 50 shows an overview of a time vs. power waveform, a second display area 52 does a waveform of a time vs. voltage, and a third display area 54 does a spectrum waveform. A first range bar 58 in the first display area 50 indicates an analysis range corresponding to a waveform displayed in the second display area 52. A second range bar 60 indicates a range corresponding to a waveform displayed in the third display area 54. A character 62 of "T" indicates a trigger point. A lower portion of the second display area 52 displaying "Start: −32.3 ms" indicates that the displayed waveform starts at a position of −32.3 m seconds from the trigger point. The third display area 54 displays a frequency analysis range with the numeric values as center frequency 800 MHz and frequency span 100 kHz. The settings of the frequency analysis range may be set by designating the center frequency and frequency span or, alternatively, done by designating beginning and ending frequencies (or start and stop frequencies) wherein if two of the four parameters are designated others are set in conjunction with them.

Positions, sizes and display contents of the display areas can be variable. The display contents may be time vs. I/Q voltages, spectrogram, constellation, tables of various numeric values, etc.

If a user observes frequency domain data displayed according to an analysis range set at first (called first analysis range hereinafter) and finds a noticeable portion, the user often wants to magnify the portion (called second analysis range hereinafter) to observe it in detail. Therefore, the existing signal analyzer features a zoom function. For example, US patent publication No. 2005/0261847 (corresponding to Japanese patent publication No. 2005-331300) discloses an invention realizing a zoom function over both frequency and time domains. It is effective to analyze frequency hopping. Japanese patent 3,377,391 discloses an invention that re-draws a spectrum in a different frequency resolution in hardware calculation by feeding time domain data stored in a memory back to a decimation filter to decimate it in a different decimation rate and conduct FFT calculation.

[Patent Document 1] US Patent Publication No. 2005/0261847

[Patent Document 2] Japanese Patent 3,377,391

DISCLOSURE OF INVENTION

Problems to be Resolved by the Invention

The inventions disclosed in the patent documents 1 and 2 derive the zoom-displaying data of the second frequency analysis range from once stored data in post-processes. Therefore, even if a signal under test changes momentarily the data of the first and second analysis ranges can not be observed while updating them. Besides, since the data of the second analysis ranges are the once-stored data, the frequency resolution is limited to resolution depending on an acquiring time length when they are acquired.

Then, what is desired is a signal analyzer that can set a first analysis range at the initial settings and a zoom-in range (second analysis range) magnifying a portion of it to observe, etc. the data while updating both of the data according to input of a signal under test.

Means for Solving the Problems

A signal analyzer according to the present invention produces data of different analysis ranges with two signal paths in parallel. A user sets a first frequency analysis range and a second frequency analysis range that is narrower than the first frequency analysis range to the signal analyzer with analysis range setting means. The first signal path produces first time domain data of a frequency converted signal under test according to first data production rate and first data acquisition time that are set based on the first frequency analysis range. The second signal path produces second time domain data of a frequency converted signal under test according to a second data production rate that is set based on a second frequency analysis range and is slower than the first data production rate. A calculation means produces receives the first and second time domain data in parallel and produces first and second frequency domain data in calculation such as fast Fourier transform. Wherein if the center frequencies of the first and second frequency analysis ranges are different, different frequency shift amounts are set in the first and second signal paths according to the difference. A second data production rate of the second signal path is lower so that a second data acquisition time can be longer than a first data acquisition time and then frequency resolution of the second frequency analysis range can be higher than that of the first frequency analysis range. The first signal path may have a delay means to offset a difference between the data production speeds of the first and second time domain data depending on the difference between the first and second data production rates. Decimation filters is used for changing the data production rates of the respective paths, for example.

A signal analyzer according to the present invention also provides a function of producing data concerning different analysis ranges in time domain analysis with updating their data in parallel. Wherein an analysis range designating means sets a first time analysis range and a second time analysis range that is narrower than the first time analysis range. The first signal path produces first time domain data of a signal under test according to a first data production rate that is set depending on the set first time analysis range. The second signal path produces second time domain data of the signal under test according to a second data production rate that is set depending on the second time analysis range and faster than first data production rate. The second signal path has a delay means for compensating a difference between data production speeds of the first and second time domain data that is caused depending on a difference between the first and second data production rates.

From another viewpoint, the present invention is a data production method for a signal analyzer that has a step of setting first data production rate and first data acquisition time according to a first frequency analysis range set by a user, producing first time domain data of a frequency converted signal under test and producing first frequency domain data from the first time domain data, and a step of setting a second data production rate that is slower than the first data production rate when a second frequency analysis range that is narrower than the first frequency analysis range is set, producing second time domain data of frequency converted signal under test and producing second frequency domain data from the second time domain data wherein the first and second frequency domain data are updated in parallel according to input of the signal under test. If the second frequency analysis range is set to be narrower than the first frequency analysis range, the second data acquisition time may be set to be longer than the first data acquisition time to make the frequency resolution of the second frequency domain data higher than that of the first frequency domain data.

Besides, the data production method for a signal analyzer according to the present invention has a step of setting a first data production rate according to a first time analysis range set by a user to produce first time domain data from a signal under test, and a step of setting a second data production rate that is faster than the first data production rate when a second time analysis range that is narrower than the first time analysis range is set to produce second time domain data from the signal under test wherein the first and second time domain data are updated in parallel according to input of the signal under test.

BEST MODE FOR REALIZING THE INVENTION

Figure 3:
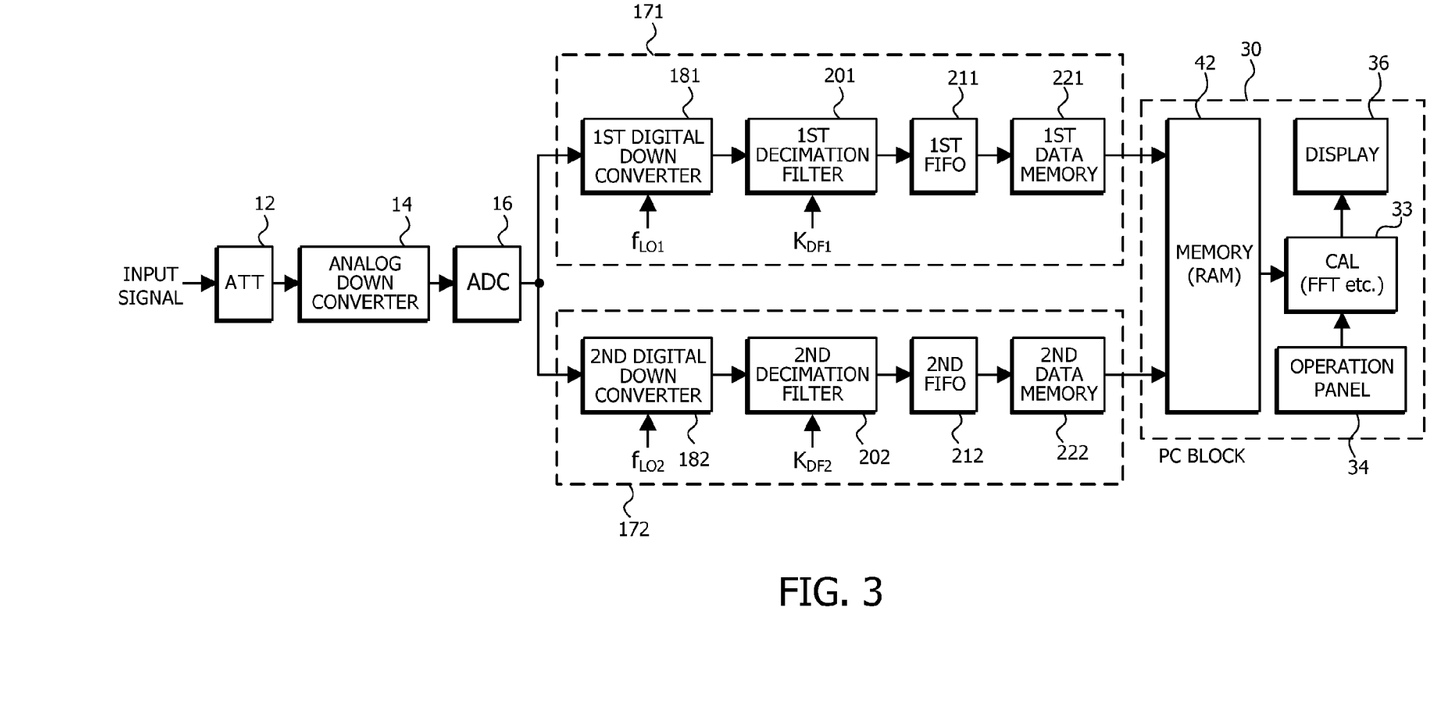

FIG. 3 is a functional block diagram of a signal analyzer according to the present invention wherein blocks corresponding to those of FIG. 1 are labeled the same. Note that it is a functional block diagram so that the blocks do not necessarily correspond to hardware elements one by one. For example, a calculation function provided by a CPU 32 is indicated as a calculation block 33. Input attenuation circuit 12, analog down converter 14, ADC 16 and PC block 30 are similar to those described concerning FIG. 1 so that their explanations are eliminated below. It also provides a function concerning trigger detection similar to the conventional one.

Figure 4:
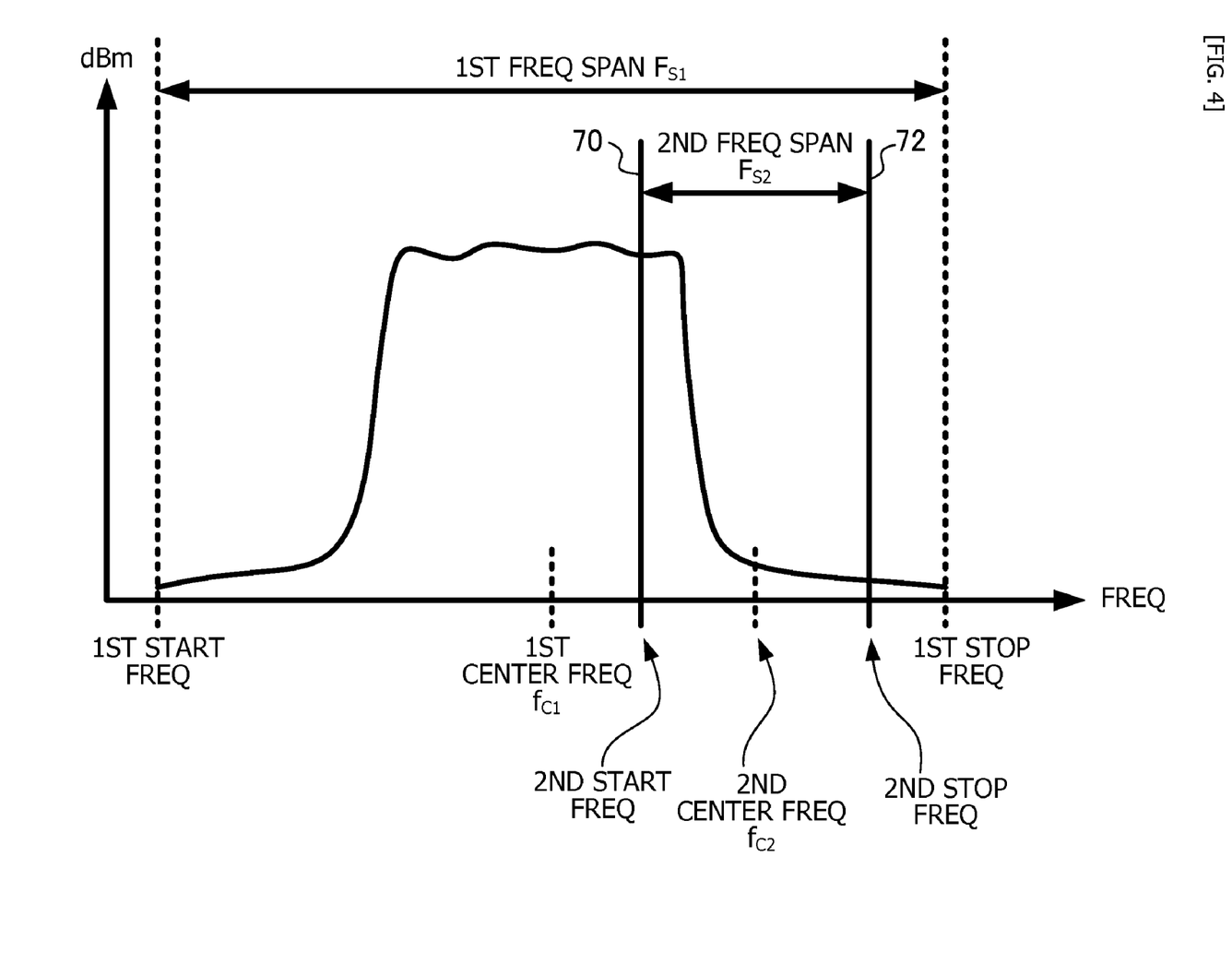

FIG. 4 is an example of displaying frequency domain data as a spectrum waveform on a screen of a display 36. First start frequency and first stop frequency define a first spectrum waveform of a first frequency analysis range, and a user moves cursors 70 and 72 with an operation panel 34 and/or a mouse 48 to designate second start frequency and second stop frequency on the first frequency analysis range to set a portion (second frequency analysis range) desired for zoom-display. A setting method is not limited to this; the start frequency, stop frequency, center frequency and frequency span are linked each other so if two of them are designated other two are set automatically. A second spectrum waveform (not shown) of the second frequency analysis range produced as described below is displayed on a display area other than that of the first spectrum waveform and in higher resolution. The first and second spectrum waveform is updated in parallel according to input of the signal under test.

Referring to FIG. 3, a signal analyzer of a preferred embodiment according to the present invention has first and second signal paths 171 and 172 that produce first and second time domain data for the first and second frequency analysis ranges respectively. A first digital down converter (DDC) 181 of the first signal path 171 conducts I/Q separation and down conversion on time domain data from an ADC 16 in digital calculation. In the digital calculation, the sine and cosine data of a first local oscillation (LO) frequency $f_{LO1}$ that is determined with a first center frequency $f_{C1}$ of the first frequency analysis range set by a user and the time domain data are multiplied and a necessary frequency component is extracted. Similarly, a second DDC 182 of the second signal path 172 conducts I/Q separation and down conversion on the time domain data from the ADC 16 using the sine and cosine data of a second local oscillation (LO) frequency $f_{LO2}$ that is determined with a second center frequency $f_{C2}$ of the second frequency analysis range. A frequency difference between the first and second LO frequencies $f_{LO1}$ and $f_{LO2}$ is a frequency difference between the first and second center frequencies $f_{C1}$ and $f_{C2}$. That is, there is a difference between frequency shift amounts of the frequency conversions in the first and second signal paths.

First and second decimation filters 201 and 202 decimate the frequency-converted time domain data from the first and second DDCs 181 and 182 according to the respective decimation rates $K_{DF1}$ and $K_{DF2}$. The relationship between the rates is indicated as follows:

$$K_{DF2}=K_{DF1}*F_{S1}/F_{S2}$$

Wherein the second frequency span $F_{S2}$ is narrower than the first frequency span $F_{S1}$ so that data production rate of the second signal path is lower than that of the first signal path. That is, the decimation rate $K_{DF2}$ of the second signal path is higher than $K_{DF1}$ of the first signal path. The higher the decimation rate is the more time the decimation process in the decimation filter requires so that the output data from the second decimation filter 202 delays relative to the time corresponding data from the first decimation filter 201. Then, a first FIFO 211 is provided to the first signal path for compensating the decimation process time difference between the first and second decimation filters and the time corresponding data between the first and second signal paths are transferred to the respective first and second data memories 221 and 222 in parallel. The second signal path can acquire data of longer time due to lower data production rate, which leads to higher frequency resolution. In a preferred embodiment, the second signal path may have a second FIFO 212 as described below.

The data temporarily retained in the first and second data memories 221 and 222 are transferred to a PC block 30 and, as similar to the conventional one, the CPU 32 conducts fast Fourier transform (FFT) to produce first and second frequency domain data of the first and second frequency analysis ranges respectively. Spectrum waveforms concerning the first and second frequency analysis ranges are displayed on the display 36 respectively using the first and second frequency domain data. The first and second frequency domain data are produced and updated in parallel according to the input of the signal under test. Therefore, the user can observe the signal under test changing momentarily in different frequency spans and different frequency resolutions at the same time.

Figure 5:
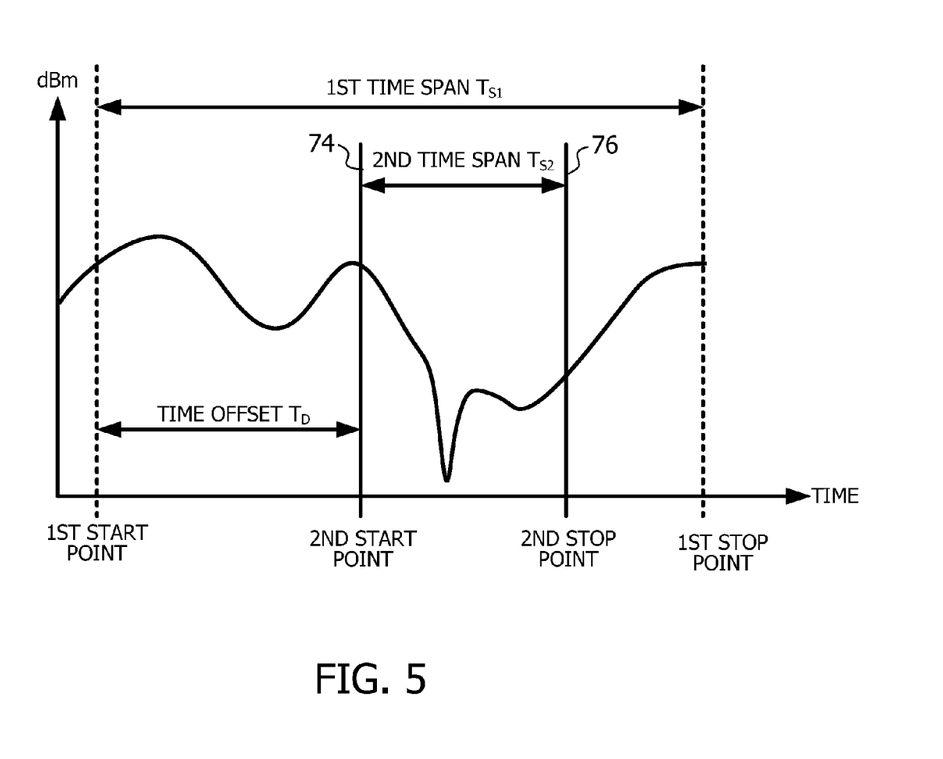

As an application of the signal analyzer according to the present invention, it can provide a magnified view of a desired portion of the time domain data in addition to the frequency domain data without changing the hardware configuration. FIG. 5 is a chart explaining the method that the time domain data of the first time analysis range set by a user is displayed and how a zoom-in range (second time analysis range) thereon is set. The first and second time analysis ranges are defined by the respective start and stop time points. The time points are designated with time differences (or offsets) from a trigger point as the trigger point is 0. A user sets the time analysis ranges by operating operation panel 34 and/or cursors 74 and 76 with mouse. Time waveforms may be time vs. power waveform, time vs. I/Q voltage waveform, etc. derived from the time domain data. The first and second LO frequencies $f_{LO1}$ and $f_{LO2}$ set to the first and second DDC181 and 182 are designated to the same one. The $K_{DF2}$ set to the second decimation filter 202 is set to be lower than $K_{DF1}$ contrary to the above frequency analysis, and then the data production rate of the second signal path becomes higher than that of the first signal path. It is indicated by following equation.

$$K_{DF2}=K_{DF1}*T_{S2}/T_{S1}$$

Wherein $T_{S1}$ and $T_{S2}$ are first and second time spans of the first and second time analysis ranges respectively.

Resultantly, a time required for the decimation process in the second decimation filter 202 is shorter than that in the first decimation filter 201 so that the second FIFO 212 is provided to delay the data for producing the time-corresponding data between the first and second signal paths in parallel. Note that there is a time offset $T_D$ which requires having the data of the first signal path delay and should be considered to adjust the delay times in the first and second FIFO 211 and 212.

Figure 6:
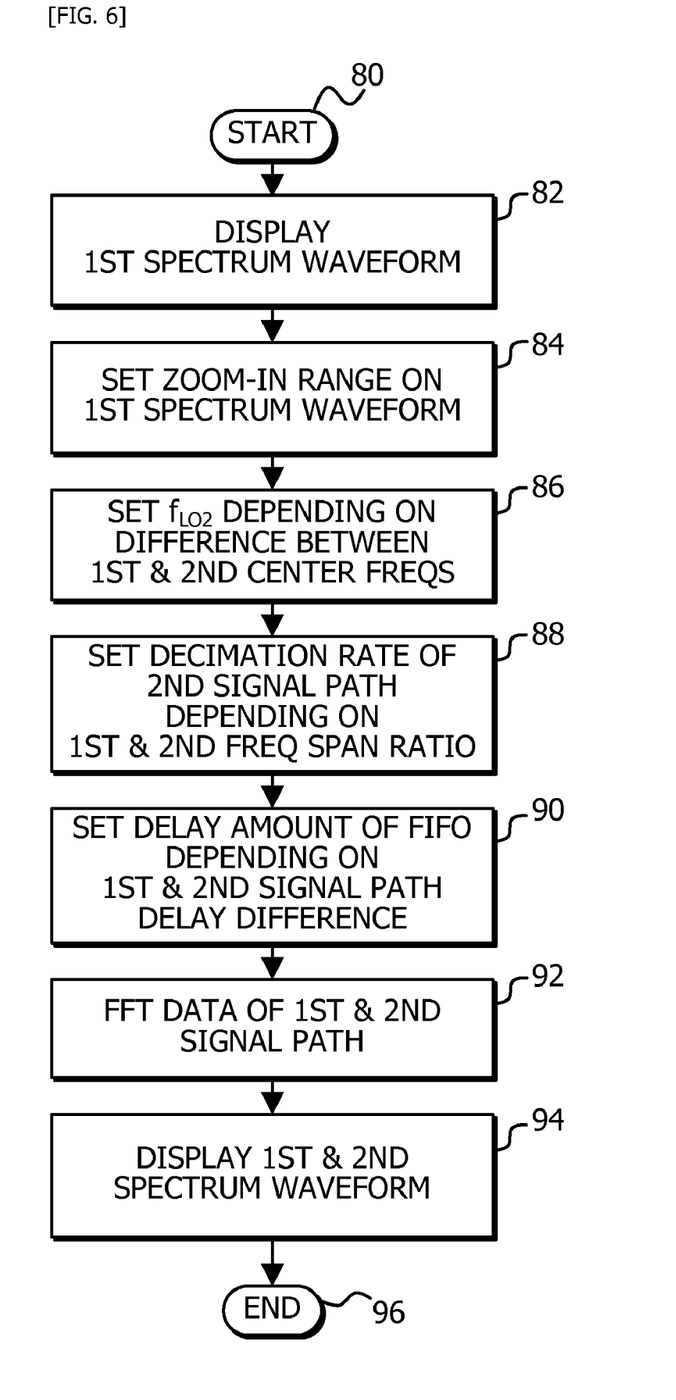

FIG. 6 is a flowchart of processes for displaying spectrum waveforms by the date production according to the present invention. As described above, the PC block 30 produces the frequency domain data to display the first spectrum waveform concerning the first frequency analysis range set by a user using the frequency-converted time domain data from the first signal path 171 (step 82). The user sets a zoom-in range (second frequency analysis range) by operating the operation panel 34 and/or cursors 70 and 72 on the display screen with the mouse 48 (step 84). The second LO frequency $f_{LO2}$ of which frequency differs from the first LO frequency $f_{LO1}$ by a difference between the first and second center frequency $f_{C1}$ and $f_{C2}$ is set to the second DDC 182 (step 86). A decimation rate is set according to the ratio between the first and second frequency spans (step 88) and the delay amount of the first FIFO 211 is set according to the delay difference due to the decimation processes between the first and second signal paths (step 90). The frequency-converted time domain data produced in the signal paths are temporarily retained in the respective data memories and then the PC block 30 conducts the FFT calculation (step 92) to display the first and second spectrum waveforms on the different display areas respectively with the display 36 (step 94).

Figure 7:
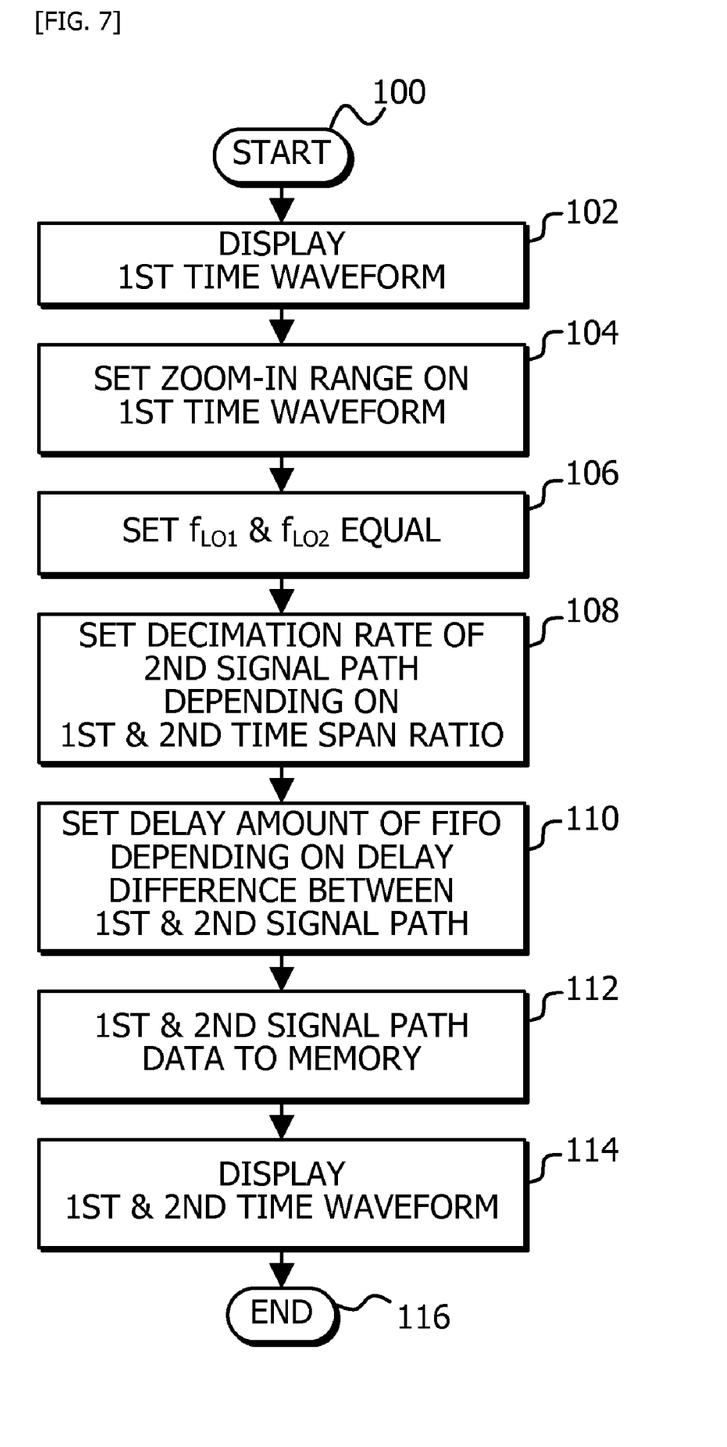

FIG. 7 is a flowchart of processes for displaying time waveforms by the date production according to the present invention. As described above, the PC block 30 conducts necessary processes using the frequency-converted time domain data from the first signal path 171 to display the first time waveform of the time vs. power waveform, time vs. I/Q voltage waveform, etc. concerning the first time analysis range set by a user (step 102). The user sets a zoom-in range (second frequency analysis range) by operating the operation panel 34 and/or cursors 74 and 76 on the display screen with the mouse 48 (step 104). The first and second LO frequencies $f_{LO1}$ and $f_{LO2}$ set to the first and second DDCs 181 and 182 are designated to the same (step 106). The decimation rate is set according to the ratio between the first and second time spans $T_{S1}$ and $T_{S2}$ (step 108) and the delay amounts of the first and second FIFOs 211 and 212 are set according to the delay difference due to the decimation processes between the first and second signal paths and time offset $T_D$ (step 110). The frequency-converted time domain data produced in the signal paths are temporarily retained in the respective data memories and then the PC block 30 conducts necessary processes to display the first and second time waveforms such as time vs. power waveforms on the different display areas respectively with the display 36 (step 114).

As described above, a signal analyzer according to the present invention can produce data of a first analysis range based on an initial settings and data of a second analysis range, or a zoom-in portion thereof from a signal under test at the same time and update them in parallel. Therefore, the signal under test that is momentarily changing can be measured and/or observed from different analysis ranges. Although the invention has been disclosed in terms of the preferred, modifications may be made. For example, the first and second signal paths may have respective ADCs one of which may feature a low bit number but fast and the other may feature a high bit number but slow.

BRIEF DESCRIPTION OF THE DRAWINGS

FIG. 3 A functional block diagram of a signal analyzer according to the present invention FIG. 4 A waveform chart showing relationship of first and second frequency analysis ranges FIG. 5 A waveform chart showing relationship of first and second time analysis ranges FIG. 6 A flowchart of processes for displaying magnified views of frequency analysis ranges FIG. 7 A flowchart of processes for displaying magnified views of time analysis ranges

DESCRIPTION OF REFERENCE MARKS

12 Input attenuation circuit
14 Analog down converter
16 Analog to digital converter
181 First digital down converter
182 Second digital down converter
201 First decimation filter
202 Second decimation filter
211 First FIFO
212 Second FIFO
30 PC block
32 CPU
34 Operation panel
36 Display apparatus
38 Bus bridge
40 Bus
42 Memory (RAM)
44 Hard disk drive
46 I/O port
48 Mouse
49 External key board
70 Cursor for setting second frequency analysis range
72 Cursor for setting second frequency analysis range
74 Cursor for setting second time analysis range
76 Cursor for setting second time analysis range

The invention claimed is:

1. A signal analyzer comprising:
an analysis range setting means for setting a first frequency analysis range and a second frequency analysis range for analyzing a signal under test with the second frequency analysis range is variable relative to and narrower than the first frequency analysis range;
a first signal path having a first frequency converter and a first decimator for producing first time domain data of a frequency converted version of the signal under test based on a first data production rate and a first data acquisition time according to the first frequency analysis range;
a second signal path having a second frequency converter and a second decimator for producing second time domain data of a frequency converted version of the signal under test based on a second data production rate that is slower than the first data production rate according to the second frequency analysis range; and
a calculation means receiving the first and second time domain data for producing first and second frequency domain data respectively in calculation.

2. The signal analyzer as recited in claim 1 wherein frequency shift amounts of the frequency conversions in the first and second signal paths are different according to the difference between the center frequencies of the first and second frequency analysis ranges.

3. The signal analyzer as recited in claim 1 wherein the second signal path produces the second time domain data of the frequency converted version of the signal under test based on a second data production rate that is slower than the first data production rate and a second data acquisition time that is longer than the first data acquisition time according to the second frequency analysis range.

4. The signal analyzer as recited in claim 1 wherein the first signal path has a delay means for compensating the difference between the data production speeds of the first and second time domain data depending on the difference between the first and second data production rates.

5. The signal analyzer as recited in claim 1 wherein the analysis range setting means sets a first time analysis range and a second time analysis range that is narrower than the first time analysis range, the first signal path produces a first time domain data of the signal under test according to a first data production rate that is set according to the set first time analysis range, and the second signal path produces second time domain data of the signal under test according to a second data production rate that is faster than the first data production rate and is set depending on the second time analysis range wherein the second signal path has a delay means for compensating the difference between data production speeds of the first and second time domain data according to the difference between the first and second data production rates.

6. A data production method for a signal analyzer comprising steps of:
inputting a signal under test to the signal analyzer;
setting a first frequency analysis range and a second frequency analysis range to the signal analyzer for analyzing the signal under test with the second frequency analysis range is variable relative to and narrower than the first frequency analysis range;
setting a first data production rate and a first data acquisition time to a first path of the signal analyzer according to the first frequency analysis range for producing first time domain data of a frequency converted version of the signal under test with the first path having a first frequency converter and a first decimator; and
setting a second data production rate that is slower than the first data production rate to a second path of the signal analyzer according to the second frequency analysis range for producing second time domain data of a frequency converted version of the signal under test with the second path having a second frequency converter and a second decimator; and
producing first and second frequency domain data from the first and second time domain data respectively wherein the first and second frequency domain data are updated in parallel according to the input of the signal under test.

7. The data production method for a signal analyzer as recited in claim 6 wherein a second data acquisition time that is longer than the first data acquisition time is set when the second frequency analysis range that is narrower than the first frequency analysis range is set to make frequency resolution of the second frequency domain data higher than frequency resolution of the first frequency domain data.

8. A data production method for a signal analyzer comprising steps of:
inputting a signal under test to the signal analyzer;
setting a first time analysis range and a second time analysis range to the signal analyzer for analyzing the signal under test with the second time analysis range is variable relative to and narrower than the first time analysis range;
setting a first data production rate to a first path of the signal analyzer according to the first time analysis range to produce first time domain data from the signal under test with the first path having a first frequency converter and a first decimator;
setting a second data production rate that is faster than the first data production rate to a second path of the signal analyzer according to the second time analysis range to produce second time domain data from the signal under test with the second path having a second frequency converter and a second decimator; and setting the same center frequency to the first and second frequency converters wherein the first and second time domain data are updated in parallel according to the input of the signal under test.

* * * * *